United States Patent
Dietz et al.

(10) Patent No.: US 7,973,333 B2
(45) Date of Patent: Jul. 5, 2011

(54) LATERAL DMOS TRANSISTOR AND METHOD FOR THE PRODUCTION THEREOF

(75) Inventors: Franz Dietz, Untereisesheim (DE); Volker Dudek, Brackenheim (DE); Thomas Hoffmann, Filderstadt (DE); Michael Graf, Leutenbach (DE); Stefan Schwantes, Heilbronn (DE)

(73) Assignee: Telefunken Semiconductors GmbH & Co. KG, Heilbronn (DE)

( * ) Notice: Subject to any disclaimer, the term of this patent is extended or adjusted under 35 U.S.C. 154(b) by 567 days.

(21) Appl. No.: 11/730,514

(22) Filed: Apr. 2, 2007

(65) Prior Publication Data
US 2007/0235779 A1   Oct. 11, 2007

Related U.S. Application Data

(63) Continuation of application No. PCT/EP2005/010455, filed on Sep. 28, 2005.

(30) Foreign Application Priority Data

Oct. 1, 2004   (DE) .......................... 10 2004 049 246

(51) Int. Cl.
*H01L 29/66* (2006.01)
(52) U.S. Cl. . 257/122; 257/141; 257/343; 257/E21.414; 257/E21.424; 257/E21.435; 257/E29.12; 257/E29.261; 438/297
(58) Field of Classification Search .................. 257/288, 257/122, 141, 349, E21.414, E21.424, E21.435, 257/E29.12, E29.261; 438/297
See application file for complete search history.

(56) References Cited

U.S. PATENT DOCUMENTS 5,539,238 A * 7/1996 Malhi ........................... 257/510
(Continued)

FOREIGN PATENT DOCUMENTS

DE   197 35 826 A1   3/1999
(Continued)

OTHER PUBLICATIONS

Vandooren et al., "Back-Gate and Series Resistance Effects in LDMOSFETs on SOI", IEEE Transactions on Electron Devices, vol. 48, No. 9, Sep. 2001, pp. 2410-2416.

*Primary Examiner* — Benjamin P Sandvik
*Assistant Examiner* — Farid Khan
(74) *Attorney, Agent, or Firm* — Muncy, Geissler, Olds & Lowe, PLLC

(57) ABSTRACT

A lateral DMOS-transistor is provided that includes a MOS-diode made of a semi-conductor material of a first type of conductivity, a source-area of a second type of conductivity and a drain-area of a second type of conductivity which is separated from the MOS-diode by a drift region made of a semi-conductor material of a second type of conductivity which is at least partially covered by a dielectric gate layer which also covers the semi-conductor material of the MOS-diode. The dielectric gate-layer comprises a first region of a first thickness and a second region of a second thickness. The first region covers the semi-conductor material of the MOS-diode and the second region is arranged on the drift region. A transition takes place from the first thickness to the second thickness such that an edge area of the drift region which is oriented towards the MOS-diode is arranged below the second area of the gate layer. The invention also relates to a method for the production of these types of DMOS-transistors.

11 Claims, 2 Drawing Sheets

U.S. PATENT DOCUMENTS

| | | | |
|---|---|---|---|
| 5,710,455 A | 1/1998 | Bhatnagar et al. | |
| 5,801,416 A | 9/1998 | Choi et al. | |
| 5,821,144 A | 10/1998 | D'Anna et al. | |
| 5,869,875 A * | 2/1999 | Hebert | 257/382 |
| 6,121,666 A | 9/2000 | Burr | |
| 6,191,453 B1 * | 2/2001 | Petruzzello et al. | 257/350 |
| 6,613,695 B2 * | 9/2003 | Pomarede et al. | 438/767 |
| 6,710,416 B1 | 3/2004 | Xu | |
| 6,806,131 B2 | 10/2004 | Bromberger et al. | |
| 6,888,205 B2 * | 5/2005 | Moscatelli et al. | 257/406 |
| 2001/0015459 A1 * | 8/2001 | Watanabe et al. | 257/341 |
| 2003/0141559 A1 * | 7/2003 | Moscatelli et al. | 257/406 |
| 2003/0153154 A1 | 8/2003 | Uehara et al. | |
| 2004/0014263 A1 * | 1/2004 | Fujishima et al. | 438/193 |

FOREIGN PATENT DOCUMENTS

| | | |
|---|---|---|
| EP | 1 271 639 A2 | 1/2003 |
| EP | 1 321 985 A1 | 6/2003 |
| GB | 2327810 A | 2/1999 |

* cited by examiner

100# LATERAL DMOS TRANSISTOR AND METHOD FOR THE PRODUCTION THEREOF

This nonprovisional application is a continuation of International Application No. PCT/EP2005/010455, which was filed on Sep. 28, 2005, and which claims priority to German Patent Application No. DE102004 049 246.8, which was filed in Germany on Oct. 1, 2004, and which are all herein incorporated by reference.

BACKGROUND OF THE INVENTION

1. Field of the Invention

The present invention relates to a lateral DMOS transistor with a MOS diode that has semiconductor material of a first conductivity type, with a source region of a second conductivity type, and with a drain region of the second conductivity type that is separated from the MOS diode by a drift region of semiconductor material of the second conductivity type, which drift region is at least partially covered by a dielectric gate layer that also covers the semiconductor material of the MOS diode, wherein the dielectric gate layer has a first region of a first thickness and a second region of a second thickness, wherein the first region covers semiconductor material of the MOS diode and the second region is located on the drift region (MOS=metal oxide semiconductor).

In addition, the invention relates to a method for producing a lateral DMOS transistor having the steps: creation of a MOS diode having semiconductor material of a first conductivity type, a source region of a second conductivity type, and a drain region of the second conductivity type that is separated from the MOS diode by a drift region composed of semiconductor material of the second conductivity type; covering the MOS diode and at least a part of the drift region by a dielectric gate layer that has a first region of a first thickness and a second region of a second thickness, wherein the first region covers semiconductor material of the MOS diode and the second region is located on the drift region.

2. Description of the Background Art

A DMOS transistor and a corresponding method are known from U.S. Pat. No. 6,191,453.

Within the scope of the present invention, a MOS diode is understood to mean any sequence of layers having a conductive control electrode, dielectric insulating layer, and layer of semiconductor material, in which a conductive inversion layer can be produced by establishing a suitable control electrode voltage. For the sake of completeness, we shall mention that an inversion layer is understood to mean a layer in which the concentration of the minority charge carriers in the semiconductor layer becomes larger than the concentration of majority charge carriers as a result of influences of the control electrode voltage. As an alternative to the metal to which the name refers, the metal layer of the MOS diode can also be made of high-conductivity semiconductor material. Instead of the oxide to which the name refers, the oxide layer of the MOS diode can also be made of another dielectric material. This also applies to the exemplary embodiments and configurations disclosed further below.

As is known, a MOS transistor is created from a MOS diode in that the semiconductor layer of the MOS diode adjoins a drain region and a source region made of semiconductor material that has a conductivity type opposite to that of the MOS diode semiconductor layer, thus forming two oppositely polarized pn junctions with the semiconductor material of the MOS diode. In the absence of effects that are produced by control electrode voltages, a voltage that is produced externally between the source region and the drain region reverse biases one of the two pn junctions so that no drain current flows between the drain region and the source region. In contrast, upon additional application of a sufficiently high control voltage, the inversion of the charge carrier concentrations in an inversion layer adjoining the dielectric results in a conductive channel region that is not bordered by pn junctions, and thus results in a current flow between the source region and the drain region.

Prior MOS power transistors were characterized by a vertical structure in which source regions and drain regions were separated by a semiconductor layer in a direction perpendicular to the control electrode. The MOS structure described with two pn junctions was made into a DMOS structure by a double diffusion which gave it its name, wherein a first diffusion of a P well region into an N material took place, and a subsequent diffusion of an N region into the P well region took place. In this context, the gate oxide served as a mask for dopant implantations. The lateral separation between the two diffusion borders formed the surface channel region located parallel to the gate oxide for controlled creation of the inversion. The remaining material of the aforementioned semiconductor layer, located between the P well region and the drain region, formed a drift region.

Today, a DMOS transistor is no longer necessarily considered to be a MOS transistor produced by a double diffusion process, but rather any MOS transistor in which the channel region is separated from the drain region by a drift region. The drift region provides for a reduced voltage gradient between the source region and the drain region, thereby improving the dielectric strength of the MOS transistor. DMOS transistors are used as high-voltage components in which voltages, known as drain voltages, of more than 100 volts can be applied between the drain region and the source region.

To improve the electrical properties of DMOS transistors, thin gate oxides of CMOS transistors (C=complementary) are increasingly also used for DMOS driver transistors. However, the dielectric strength decreases with decreasing gate thickness, so that the DMOS transistors are more sensitive to voltage spikes.

To improve the electrical properties of MOS transistors, the aforementioned U.S. Pat. No. 6,191,453 discloses a circular structure in which the source electrode is arranged on an outer circumference and the drain electrode is arranged on an inner circumference. A dielectric gate layer has a smaller thickness in the channel region of the structure than in the area of a drift region. In this context, the portion of the gate layer that has the smaller thickness extends beyond the channel region to the drift region, so that a part of the drift region adjacent to the channel region is likewise covered with the gate layer of smaller thickness. U.S. Pat. No. 6,191,453 discloses no details concerning the method of production. However, the cross-section of the gate layer, which extends to the depth of the semiconductor substrate and is laterally tapered in a stepped manner, indicates production through repeated application of a LOCOS process, which is to say gate oxide formation through local oxidation of silicon.

The use of the LOCOS technique results in an indistinct transition between the first oxide thickness and the second oxide thickness, as well as a pronounced consumption of silicon in the substrate. The silicon consumption results in an edge in the substrate, which entails an undesirable increase in the turn-on resistance.

A primary development goal in the area of DMOS transistors is to achieve a low specific turn-on resistance at the same time as high dielectric strength. In integrated circuits in which the DMOS transistors occupy a significant percentage of total chip area, the intent is to reduce the amount of space used in the integrated circuits.

SUMMARY OF THE INVENTION

It is therefore an object of the present invention to provide a lateral DMOS transistor with further improved electrical parameters such as high dielectric strength, low turn-on resistance, and high saturation current.

This object is attained in a lateral DMOS transistor of the aforementioned type in that a transition from the first thickness to the second thickness is accomplished such that an edge area of the drift region facing the MOS diode is also located beneath the second region of the gate layer.

In addition, this object is attained in a method of the aforementioned type in that a gate layer with the second thickness is produced above an edge area of the drift region facing the MOS diode.

Due to these features, firstly, a thin gate oxide is used in the area of the channel of the DMOS transistor, which results in a desirable low turn-on resistance. The thicker oxide in the area of the drift region ensures high dielectric strength of the DMOS transistor. Thus, studies have shown that the voltage in the edge area of the drift region adjacent to the channel region can still be high enough, despite the voltage-reducing effect of the drift region, that a thin gate oxide could break down. As a result of the inventive creation and placement of a gate layer with the second, greater thickness precisely in the edge area of the drift region facing the MOS diode, the dielectric strength there is increased substantially. In the channel region, by contrast, it is still possible with the invention to make continued use of the advantages of a small gate layer thickness over the channel region, since no large voltage differences arise across the gate layer here. Another important advantage that results is an improved compatibility in an integrated circuit between CMOS modules, for which the comparatively small gate layer thickness are advantageous, and DMOS modules, which require greater gate layer thicknesses in certain areas.

An embodiment of such a DMOS transistor is characterized by a stepped transition between the first region of the first thickness and the second region of the second thickness.

The MOS diode is separated from the drift zone by a pn junction, wherein the pn junction additionally separates the channel region with a lower risk of breakdown from the edge area of the drift region, where a greater risk of breakdown still exists. By means of the stepped design of the transition between the first region of the first thickness and the second region of the second thickness, the best possible compromise is struck between the requirements for good insulation above the drift region and the requirement for low turn-on resistance of the MOS diode.

In addition, it is preferred for a dielectric-filled trench structure to be located in the drift region between the drain region and the MOS diode.

As a result of the trench structure, a drift region shape is achieved that has a partially vertical design of the drift region along the side walls of the trench, which improves the length of the drift region and thus the dielectric strength for a given lateral extent. However, in the presence of an applied reverse voltage, nonuniformities can arise in the voltage distribution at the edges of the trench structure that adversely affect the reverse voltage of the transistor. It is a particular advantage of the invention that it improves the dielectric strength even in the edge area of the drift region adjacent to the MOS diode, since such nonuniformities can arise there.

The source region can be embedded in a well region that is made of semiconductor material of the first conductivity type and that also constitutes the semiconductor material for the MOS diode. In addition, it is preferred for the drain region to be surrounded by a well region of a second conductivity type that also constitutes the material of the drift region.

This embodiment can be implemented within the framework of a standard process in terms of manufacturing technology.

The thickness of the dielectric gate layer can be 8 to 12 nm in the area of the MOS diode and to be 28 to 32 nm in the area of the drift region.

These dimensions have proven advantageous in concrete applications. However, the invention is not limited to these dimensions, of course.

With regard to embodiments of the method, a semiconductor substrate can be covered with a first dielectric layer, that the dielectric layer above a future channel region is removed at least in part, and that the resulting structure is covered with a second dielectric layer so that the result is a first region of a first thickness and a second region of a second thickness, wherein the first thickness is determined by the thickness of the second dielectric layer, and the second thickness is determined by the combined total of the thicknesses of the first and second dielectric layers. In this regard, the thickness of the second dielectric layer can be independent of its substrate. As a rule, the second dielectric layer grows faster on exposed semiconductor material than on an existing oxide layer. Because of this embodiment, a sequence of standard steps results in a production method by which any desired thicknesses of the first and second regions can be established.

The surface of a semiconductor substrate can be prepared differently over a future channel region prior to growth of a dielectric layer than over a drift region, so that a lower growth rate of the dielectric layer results over the future channel region than over the drift region.

This embodiment has the advantage that inventive structures can be established with a smaller number of manufacturing steps than is the case with the preceding embodiment.

The surface preparation can take place in a manner that is self-aligning to a dopant implantation by which a difference is created between the conductivity types of the drift region and the MOS diode.

With this embodiment, an optimal matching is produced between the behavior of the pn junction that separates the MOS diode from the drift region and the behavior of the transition from the first thickness of the gate layer to the second thickness.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
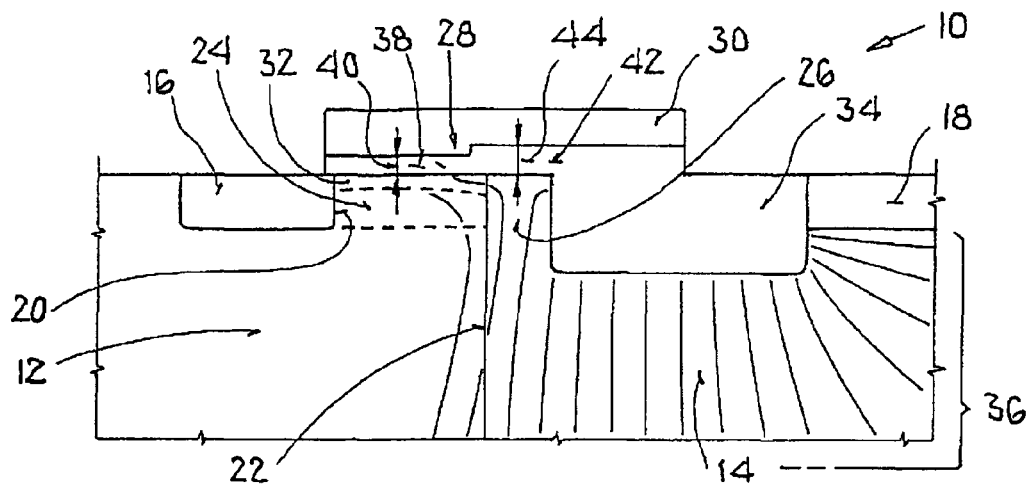
FIG. 1 illustrates an exemplary embodiment of an inventive lateral DMOS transistor.

FIG. 1 shows a lateral DMOS transistor 10, which has a first well region 12 made of semiconductor material of a first conductivity type, and a second well region 14 of semiconductor material of a second conductivity type. The two conductivity types are different, so that when the first well region 12 has a P-type conductivity, the second well region 14 has an N-type conductivity, and vice versa. A source region 16 of the second conductivity type is located in the first well region 12, and the second well region 14 has a drain region 18 that likewise has the second conductivity type. The drain region 18 thus has the same conductivity type as the adjacent second well region 14. It differs from the second well region 14 by a higher dopant concentration and thus a more pronounced conductivity, however.

Because of the different conductivity types, a pn junction 20 is formed between the source region 16 and the first well region 12. Similarly, a pn junction 22 is formed between the first well region 12 and the second well region 14. The two pn junctions 20, 22 delimit a semiconductor region 24 located between them that, as a subregion of the well region 12, has the first conductivity type. The semiconductor region 24 of the first conductivity type and an adjacent subregion 26 of the well region 14 of the second conductivity type are covered by a dielectric gate layer 28 that preferably includes oxide or nitride of the semiconductor material. A highly conductive, generally metallic, gate electrode 30 extends over the dielectric gate layer 28.

The semiconductor region 24, the gate layer 28 located on it, and the gate electrode 30 extending over that, form the MOS diode (24, 28, 30) in which a highly conductive channel region 32 of the second conductivity type can be formed in the semiconductor region 24 of the first conductivity type in a boundary layer adjacent to the dielectric gate layer 28 as a function of the voltage at the gate electrode 30. For example, with a sufficiently positive voltage at the gate electrode 30, an N-conductive channel region 32 forms in a P-conductive semiconductor region 24. As a result, the pn junctions 20, 22 at the boundaries of the channel region 32 disappear, whereupon continuous N conductivity arises between the drain region 18 and source region 16. With a voltage difference present between the source region 16 and the drain region 18 a current then flows, the amplitude of which can be controlled by the voltage at the gate electrode 30. A sufficient reduction in the positive voltage at the gate electrode 30 causes the inversion in the conductivity in the boundary layer to the dielectric layer 28, and thus the conductivity of the channel region 32, to disappear. With a voltage difference present between the source region 16 and the drain region 18, one of the two pn junctions 20 or 22 is then reverse biased, so no current flows between the source region 16 and the drain region 18.

In contrast to the semiconductor region 24, no inversion takes place in the semiconductor region 26 at the boundary with the dielectric gate layer 28, on account of the different conductivity type. The current flow through the semiconductor region 26 and the rest of the well region 14 located between the first well region 12 and the drain region 18 thus depends largely on the voltage difference between the source region 16 and the drain region 18. Since a part of the voltage between the source region 16 and the drain region 18 drops across the second well region 14, also called the drift region, the dielectric strength between the source region 16 and drain region 18 increases in the presence of such a drift region.

A dielectric trench structure 34, for example an oxide filled trench structure 34 produced by means of the shallow trench isolation (STI) technique, reduces the vertical electric field and thus avoids early breakdown. The portion of the gate electrode 30 located outside the MOS diode over the well region 14, and thus over the drift region, which portion actually has no gate function, is also referred to as a field plate. Without the conductive field plate, early breakdown would occur due to field strength spikes on the drift-side edge of a gate electrode. In particular, the trench structure 34 reduces the field emerging from an edge of the field plate in the semiconductor material of the well 14. In this way, the dielectric strength between the source region 16 and drain region 18 is further increased. The symbol 36 labels an idealized curve of equipotential lines in the drift region for the case of a drain region 18 that is positive with respect to both the source region 16 and the gate electrode 28, wherein source and gate voltages are equal. Under such boundary conditions, the voltage in the subregion 26 of the second well region 14, which still lies beneath the dielectric gate layer 28, is not yet fully eliminated. There thus exists a voltage difference between the subregion 26 and the gate electrode 30. For high-voltage transistors 10, approximately 5-10 volts can easily still be present here, so that a thin gate oxide (thickness<10 nm) could break down. This danger no longer exists in the channel region 32.

Now, one could on the one hand increase the thickness of the dielectric gate layer 28 overall to such an extent that its breakdown rating is sufficient. On the other hand, the thickness of the dielectric gate layer 28 over the channel region 32 should be as small as possible in order to achieve, e.g., the lowest possible turn-on resistance.

In the lateral DMOS transistor 10 from FIG. 1, this conflict of goals is resolved in that the dielectric gate layer 28 has a first region 38 of a first thickness 40 and a second region 42 of a second thickness 44, wherein the first region 38 covers semiconductor material of the MOS diode (24, 28, 30), thus is located above the channel region 32, and the second region 42 is located on the subregion 26 of the second well region 14, hence on the drift region. It is important in this context that a transition from the first thickness 40 to the second thickness 44 takes place in such a manner that an edge area of the drift region facing the MOS diode (24, 28, 30), and hence the channel region 32, which is to say in particular an edge area of the subregion 26, is located beneath the second region 42 of the dielectric gate layer 28. In other words, the transition from the first thickness 40 to the second thickness 44 should always take place such that the edge area of the drift region bordering on the pn junction 22, which is to say the edge area of the subregion 26 of the second well region 14, is located entirely below the second region 42 of the gate layer 28. Thus, in the object from FIG. 1, the transition can be somewhat to the left of the pn junction 22 or precisely above the pn junction 22, but not to the right of the pn junction 22. In the ideal case, the transition is stepped and is located precisely above the pn junction 22. The first thickness 40 is, for example, 8-12 nm, and the second thickness is, for example, 28-32 nm.

Various exemplary embodiments of an inventive method for producing the DMOS transistor from FIG. 1 are explained below with reference to FIGS. 2-7.

Figure 2:
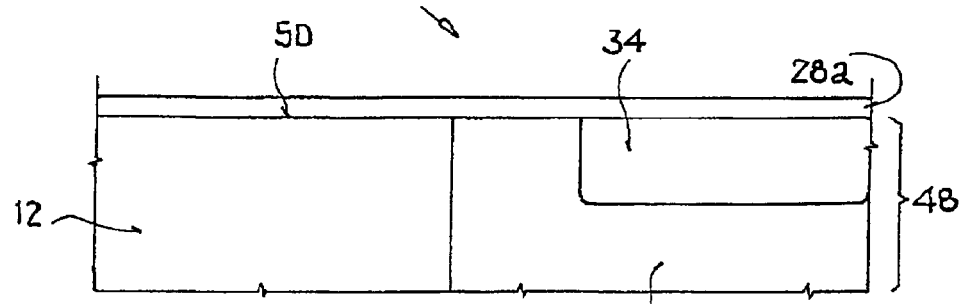
FIG. 2 illustrates a preliminary product of the DMOS transistor from FIG. 1 in a first intermediate stage of a first exemplary embodiment of an inventive production method.

FIG. 2 shows a preliminary product 46*a* of the DMOS transistor 10, in which a semiconductor substrate 48 already has a well region 12 of a first conductivity type, a well region 14 of a second conductivity type, and a dielectric trench structure 34 in the well region 14. Following a planarization of the semiconductor substrate 48, a first dielectric gate layer 28*a* is first applied to the surface 50 produced by the planarization step. This can take place by thermal oxidation of the semiconductor material at the surface 50, for example.

Figure 3:
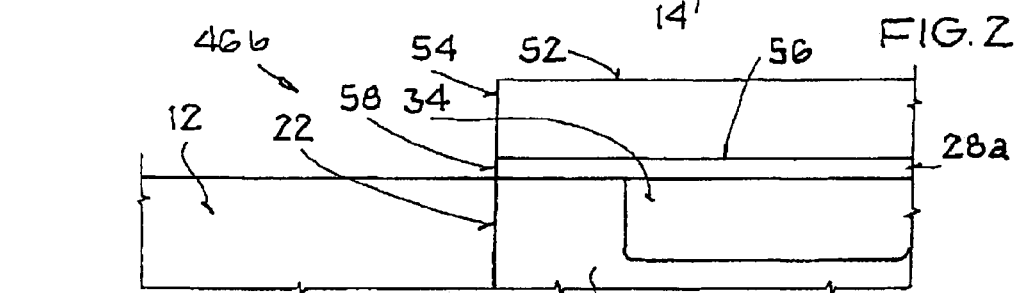
FIG. 3 illustrates the preliminary product from FIG. 2 after additional process steps.

Next, a mask 52, for example of photoresist, is produced over the well region 14 as shown in FIG. 3. FIG. 3 shows a preliminary product 46*b* that is produced by further processing the preliminary product 46*a*. The further processing includes an, e.g., isotropic etching step that removes the part of the dielectric layer 28*a* that lies over the first well region 12 outside mask 52. By means of a lithography step, an edge 54 of the mask 52 is positioned as accurately as possible over a pn junction 22 that separates the well regions 12, 14. The mask 52 is then removed, so that a surface 56 of the rest of the dielectric gate layer 28*a* is exposed. The resulting surface of the preliminary product 46*b* then has a step 58, where a dielectric layer 28*a* is exposed to the right of the step and a surface of the first well region 12 is exposed to the left of the step 58.

Figure 4:
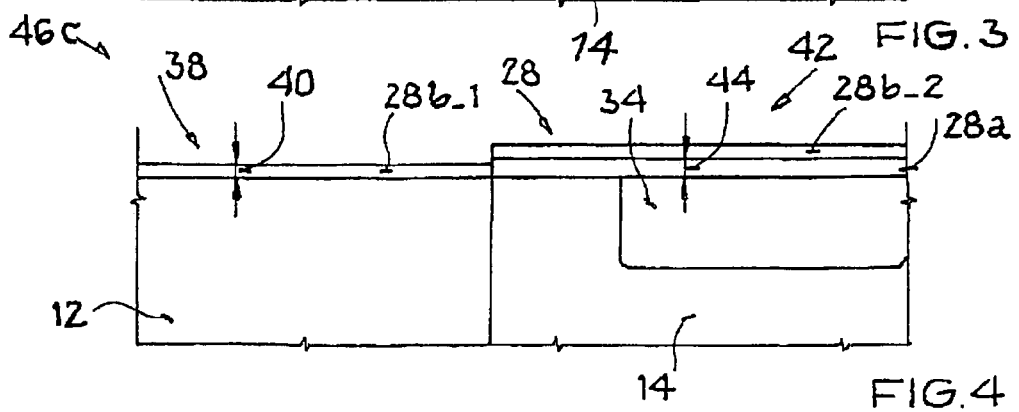
FIG. 4 illustrates the preliminary product from FIG. 3 after the production of the dielectric gate layer with a first region of a first thickness and a second region of a second thickness.

An additional dielectric layer 28*b*_1 and 28*b*_2 is produced over the exposed surface of the well region 12, the step 58, and the remainder of the dielectric layer 28, as shown in FIG. 4 as part of the preliminary product 46*c*. This, too, can be done by means of a thermal oxidation in which an oxide layer 28*b*_1 grows on the previously exposed surface of the well region 12, and an oxide layer 28*b*_2 grows on the surface of the remainder of the dielectric layer 28. In this regard, the thickness of the additional dielectric layers 28*b*_1 and 28*b*_2 can be different, since oxide grows faster on exposed semiconductor material than on an oxide layer that is already present.

The combination of the dielectric layers 28*a*, 28*b*_1 and 28*b*_2 forms the dielectric gate layer 28 of the DMOS transistor 10 from FIG. 1. FIG. 4 shows a preliminary product 46*c* with a first dielectric layer 28*a* and a second dielectric layer 28*b*_1 and 28*b*_2. The part 28*b*_1 of the second dielectric layer comprises the first region 38, described in connection with FIG. 1, having a first thickness 40. In contrast, the second region 42 from FIG. 1 with the second thickness 44 is defined by the sum of the thicknesses of the first dielectric layer 28*a* and the second dielectric layer 28*b*_2. A DMOS transistor 10, such as is described in connection with FIG. 1, is then produced from the preliminary product 46*c* shown in FIG. 4 by means of structuring and doping steps that are known per se.

As an alternative to such a production process, in which the dielectric layer 28 shown in FIG. 1 is produced in two sections, it can also be produced in a single step.

Two variations of such an embodiment with a single step for producing a stepped dielectric layer are described below with reference to FIGS. 5-7. Both variations have in common the establishment of locally different growth conditions for a dielectric layer through structured preparation of a semiconductor surface.

Figure 5:
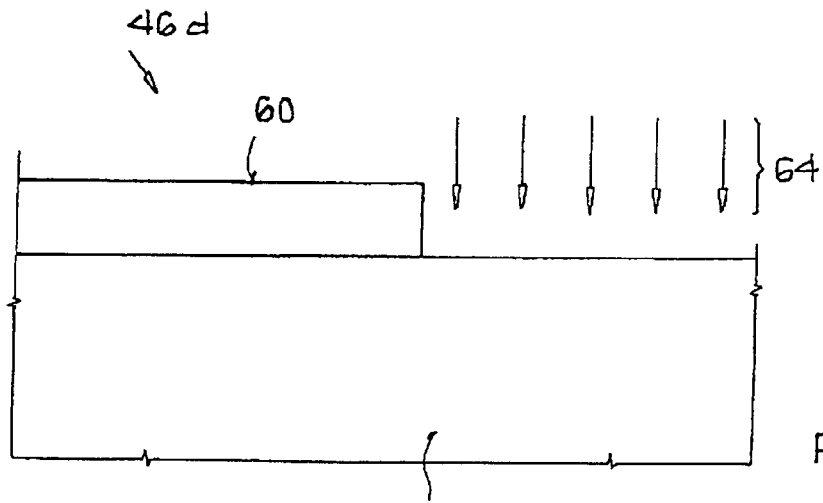
FIG. 5 illustrates a preliminary product of the DMOS transistor from FIG. 1 in a first intermediate stage of a first variation of a second exemplary embodiment of an inventive production method.

In a first variation that is shown in FIG. 5, a local surface preparation takes place at the same time as a well implantation, and in a manner that is self-aligning therewith. FIG. 5 shows the totality of a preliminary product 46*d* of a DMOS transistor from FIG. 1. A mask 60 covers a part of a semiconductor substrate 62, which initially has, e.g., a uniform first conductivity type. A dopant implantation to create a well of material of a second conductivity type then takes place as represented by arrows 64. A chemical or physical surface preparation that influences a growth rate of a dielectric layer in a subsequent step takes place simultaneously with the doping.

Alternatively, the chemical or physical surface preparation takes place after the well implantation. This is represented by arrows 68 for a preliminary product 46*e* of a DMOS transistor in FIG. 6. In contrast to FIG. 5, a semiconductor substrate 66 from FIG. 6 already has two well regions 12, 14 with different conductivity types and has a dielectric trench structure 34. One of the two well regions 12, 14, namely the well region 12 in the subject of FIG. 6, in which the channel region is later produced, is covered by the mask 60 that marks the pn junction between the two well regions 12, 14. In this case, the surface preparation represented by arrows 68 takes place such that a more rapid growth of dielectric material later takes place over the well region 14 with the dielectric structure 34 than on the well region 12 exposed by the mask 60.

Figure 6:
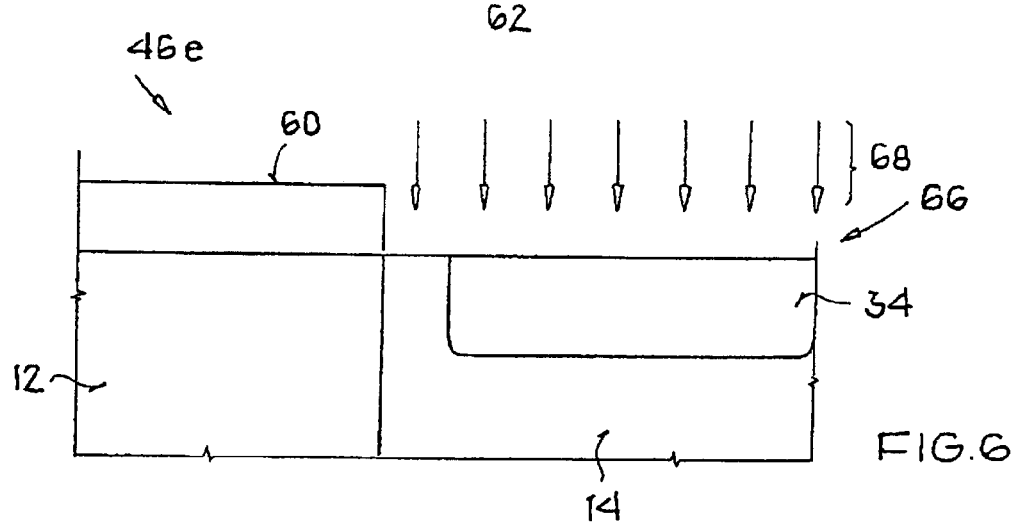
FIG. 6 illustrates a preliminary product of the DMOS transistor from FIG. 1 in a first intermediate stage of a second variation of a second exemplary embodiment of an inventive production method.
Figure 7:
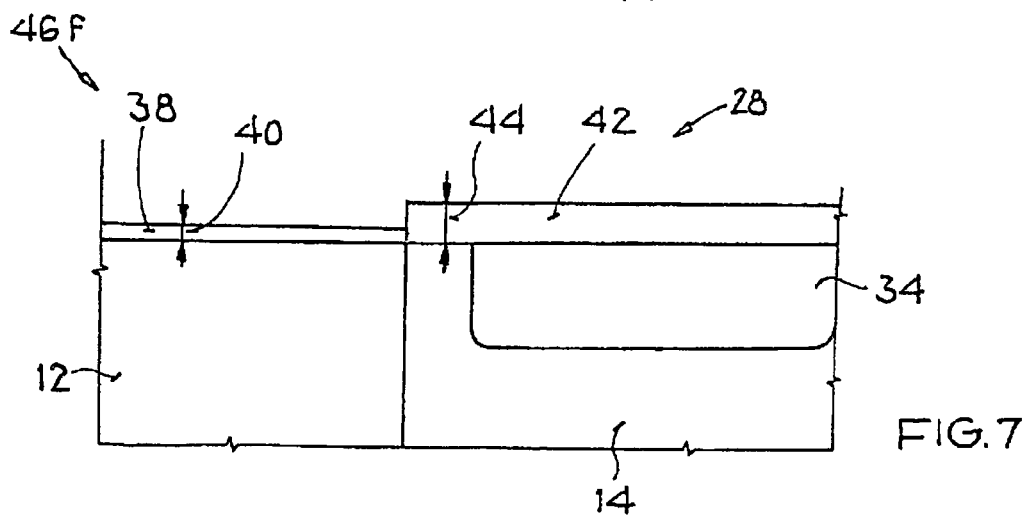
FIG. 7 illustrates the preliminary product from FIG. 5 or FIG. 6 after the production of the dielectric gate layer with a first region of a first thickness and a second region of a second thickness.

FIG. 7 shows the semiconductor substrate from FIGS. 5 and 6 that has been further processed into a preliminary product 46*f* following a removal of the mask 60 and an application of the dielectric layer 28, which can take place through thermal oxidation, for example. Due to the locally different surface preparation described in connection with FIGS. 5 and 6, the oxide grows more rapidly over the well region 14 than over the well region 12, so that a dielectric layer 28 with a first region 38 of a first thickness 40 and with a second region 42 with a second thickness 44 and a stepped transition between the two thicknesses is established, wherein the stepped transition takes place precisely over the pn junction between the well regions 12 and 14.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A lateral DMOS transistor comprising:
    a MOS diode that has semiconductor material of a first conductivity type;
    a source region of a second conductivity type;
    a drain region of the second conductivity type;
    a drift region composed of semiconductor material of the second conductivity type, wherein the drain region is separated from the MOS diode by the drift region;
    a dielectric gate layer, which has a first region of a first thickness and a second region of a second thickness that is greater than the first thickness;
    a trench structure that is filled with a dielectric; and
    a gate electrode, which is arranged over the first region and the second region of the dielectric gate layer and arranged as a field plate over the trench structure,
    wherein the drift region is partially covered by the dielectric gate layer, which dielectric gate layer also covers the semiconductor material of the MOS diode;

wherein the first region of the dielectric gate layer covers the semiconductor material of the MOS diode, the second region of the dielectric gate layer being positioned on an edge area of the drift region facing the MOS diode, the dielectric gate layer at least partially covering the trench structure, and the trench structure being positioned in the drift region between the drain region and the MOS diode;

wherein a transition is made from the first thickness to the second thickness such that the edge area of the drift region facing the MOS diode is already positioned beneath the second region of the dielectric gate layer; and a progression of a pn junction, which separates the MOS diode from the drift region, is aligned with the progression of the transition from the first thickness to the second thickness of the dielectric gate layer.

2. The DMOS transistor according to claim 1, wherein a stepped transition is provided between the first region of the first thickness and the second region of the second thickness.

3. The DMOS transistor according to claim 1, wherein the source region is embedded in a well region that is made of semiconductor material of the first conductivity type, and which also provides the semiconductor material for the MOS diode.

4. The DMOS transistor according to claim 1, wherein the drain region is surrounded by a well region of the second conductivity type that is also the material of the drift region.

5. The DMOS transistor according to claim 1, wherein the thickness of the dielectric gate layer is 8 to 12 nm in the area of the MOS diode and is 28 to 32 nm in the area of the drift region.

6. A method for producing a lateral DMOS transistor, the method comprising:
    forming an MOS diode in a first well region of a first conductivity type, the MOS diode having semiconductor material of the first conductivity type;
    forming a source region of a second conductivity type in the first well region;
    forming a drain region of the second conductivity type in a second well region of the second conductivity type, which is separated from the MOS diode by a drift region within the second well region that is made of semiconductor material of the second conductivity type;
    covering the semiconductor material of the MOS diode and part of the drift region by a dielectric gate layer, the dielectric gate layer having a first region of a first thickness and a second region of a second thickness that is larger than the first thickness, wherein the first region covers the semiconductor material of the MOS diode, and the second region is located in an edge area of the drift region facing the MOS diode such that the edge area is positioned beneath the second region of the dielectric gate layer;
    aligning, by way of a lithography step, an edge of a mask to a pn junction that separates the well regions;
    generating the first thickness and the second thickness of the dielectric gate layer by the mask; and
    providing a gate electrode onto the first region and the second region of the dielectric gate layer.

7. The method according to claim 6, further comprising:
    covering a semiconductor substrate with a first dielectric layer;
    removing the dielectric layer at least in part by the mask above a location where the channel of the device will be formed; and
    covering the resulting structure with a second dielectric layer so that the result is the first region of the first thickness and the second region of the second thickness,
    wherein the first thickness is determined by the thickness of the second dielectric layer, and the second thickness is determined by the combined total of the thicknesses of the first dielectric layer and the second dielectric layer.

8. The method according to claim 6, wherein a surface of the semiconductor substrate is prepared differently over the location where the channel of the device will be formed prior to growth of a dielectric layer than over the drift region, so that a lower growth rate of the dielectric layer results over the future channel region than over the drift region.

9. The method according to claim 8, wherein the surface preparation takes place in a manner that is self-aligning to a dopant implantation.

10. The DMOS transistor according to claim 1, wherein the pn junction is formed by the boundary between the MOS diode and the drift region.

11. The method according to claim 6, wherein the pn junction is formed by the boundary between the first well region and the second well region.

* * * * *